United States Patent [19]

Tokunaga et al.

[11] Patent Number: 4,931,410
[45] Date of Patent: Jun. 5, 1990

[54] PROCESS FOR PRODUCING SEMICONDUCTOR INTEGRATED CIRCUIT DEVICE HAVING COPPER INTERCONNECTIONS AND/OR WIRINGS, AND DEVICE PRODUCED

[75] Inventors: Takafumi Tokunaga, Tokorozawa; Masatoshi Tsuneoka, Ohme; Koichiro Mizukami, Akishima, all of Japan

[73] Assignee: Hitachi, Ltd., Tokyo, Japan

[21] Appl. No.: 236,176

[22] Filed: Aug. 25, 1988

[30] Foreign Application Priority Data

Aug. 25, 1987 [JP] Japan ................... 62-210818

[51] Int. Cl.$^5$ ............................................. H01L 27/08
[52] U.S. Cl. .................................... 437/189; 437/228; 437/194; 437/192; 437/200
[58] Field of Search .............. 437/192, 198, 183, 228, 437/189, 190, 229, 195, 51, 194, 200; 156/666, 656; 148/DIG. 131; 357/71

[56] References Cited

U.S. PATENT DOCUMENTS

| | | | |
|---|---|---|---|
| 4,184,909 | 1/1980 | Chang et al. | 437/190 |
| 4,386,116 | 5/1983 | Nair et al. | 357/71 |
| 4,666,569 | 5/1987 | Basol | 437/189 |
| 4,742,014 | 5/1988 | Hooper et al. | 437/198 |
| 4,783,695 | 11/1988 | Eichelberger et al. | 357/71 |

*Primary Examiner*—Brian E. Hearn
*Assistant Examiner*—Tuan Nguyen
*Attorney, Agent, or Firm*—Antonelli, Terry & Wands

[57] ABSTRACT

Disclosed is a process for forming a patterned copper layer on a substrate, using a patterned photoresist layer for forming the patterned copper layer. Etching mask and anti-oxidizing layers are formed on a copper layer (from which the patterned copper layer is formed) prior to forming the patterned photoresist layer. The uppermost one of the etching mask and anti-oxidizing layers is etched using the patterned photoresist layer as a mask, and then the patterned photoresist layer is removed, by oxygen plasma treatment, with the copper layer covered by the lower one of the etching mask and anti-oxidizing layers. By removing the patterned photoresist layer, by oxygen plasma treatment, while the copper layer is covered, oxidation of the copper layer during the oxygen plasma treatment can be avoided. The patterned copper layer can be an interconnection or wiring of a semiconductor device, formed on a semiconductor substrate having semiconductor elements therein. Also disclosed is the product formed by this method, such product including at least a residue of the etching mask layer in addition to the anti-oxidizing layer.

41 Claims, 6 Drawing Sheets

PROCESS FOR PRODUCING SEMICONDUCTOR INTEGRATED CIRCUIT DEVICE HAVING COPPER INTERCONNECTIONS AND/OR WIRINGS, AND DEVICE PRODUCED

BACKGROUND OF THE INVENTION

The present invention generally relates to a process for forming a patterned copper layer, and the patterned copper layer formed. More particularly, the present invention is directed to a technique which can be applied for forming copper interconnections and/or wirings of semiconductor devices (for example, a technique for forming integrated circuit devices having patterned copper interconnections and/or wirings, including multi-level interconnections and/or wirings), and the semiconductor device (integrated circuit device) produced.

As a result of the increase in high-speed operation, and increased integration, of large scale integrated circuits (LSI's), there has been a demand for material for the interconnections and for the wirings, in such LSI's, which are lower in resistance and higher in reliability than aluminum, which has previously been employed for the interconnections and wirings.

As a material which satisfies these requirements of decreased resistance and increased reliability, copper (having a resistivity of 1.56 $\mu\Omega$-cm) has attracted special interest recently. A recently developed process for forming copper interconnections is discussed in Extended Abstracts (The 47th Meeting, September 1986), 30 p-N-12, page 513, the Japan Society of Applied Physics. According to this process, a copper film is formed on a titanium nitride (TiN) film, and another TiN film is formed on the copper film; thereafter, a photoresist pattern having a predetermined configuration is formed on the upper TiN film. With this photoresist pattern used as a mask, the upper TiN film is etched by reactive ion etching (RIE), and the photoresist pattern is then removed. Next, with the etched TiN film used as a mask, the copper film is etched by ion milling to form the copper interconnection. In the disclosed technique, the TiN underlayer was provided beneath the copper as a diffusion barrier, to prevent diffusion of the copper into the substrate (of silicon or silicon oxide).

The product formed by such recently developed process, including an ion milling of the copper layer, is shown in FIG. 6. Thus, FIG. 6 shows a TiN barrier layer 63 between the substrate (of SiO$_2$) 64 and patterned copper layer 62, with a TiN layer 61, utilized as a mask in etching the copper to provide patterned copper layer 62, being also shown in this FIG. 6. As is clear from FIG. 6, the profile of the pattern is tapered, with $\theta_1$ being less than 90° (for example 60°–70°). Moreover, due to the tapered profile of the copper layer, the minimum space between interconnections (that is, the space shown in FIG. 6), as well as the minimum line width, is approximately 3 $\mu$m. In addition, through use of the ion milling for etching the copper, the substrate will be etched (as shown by reference character 66 in FIG. 6), for example, to a thickness of at least 1,000Å (0.1 $\mu$m).

In the foregoing recently developed process, ion milling is utilized to etch the copper; previous to use of such ion milling to etch the copper, it had been difficult to etch copper utilized for interconnections and/or wiring layers of semiconductor devices. Moreover, in the above-discussed recently developed process, TiN is utilized between the photoresist and copper due to poor selectivity, for etching, of the photoresist over copper, and poor selectivity, for etching, of the photoresist over the substrate material (silicon oxide or silicon) on which the copper layer is formed. In this recently developed process, ion milling is used only to etch the copper; conventional photolithography is utilized to form the pattern in the photoresist, with reactive ion etching, known in the art, being used to etch the TiN.

SUMMARY OF THE INVENTION

According to studies conducted by the present inventors, the following problem arises in utilizing the above-discussed recently developed process for forming the copper interconnections or wirings. Namely, it is difficult to form a copper interconnection or wiring having a low resistance, because the copper film, which is beneath the TiN mask, is oxidized when the -photoresist pattern is removed, e.g., by an oxygen plasma treatment. Thus, that portion of the copper exposed after etching of the upper TiN film (but prior to etching of the copper layer) will be oxidized when the photoresist pattern is removed.

Moreover, due to the tapered profile of the interconnections, increased reduction of the space between the interconnections or wirings, as well as increased reduction in line width of such interconnections or wirings, is limited.

Accordingly, it is an object of the present invention to provide a process for forming a patterned copper layer, utilizing a photoresist pattern, while avoiding oxidation of the copper layer.

It is a further object of the present invention to provide a process for forming a patterned copper layer, utilizing a photoresist pattern, wherein the photoresist pattern is removed by an oxygen plasma treatment, and wherein oxidation of the copper layer is avoided when removing the photoresist.

It is a further object of the present invention to provide a process of forming copper interconnections and/or wirings for semiconductor devices, including multi-layer copper interconnections and/or wirings, utilizing a photoresist in the patterning of a copper layer to provide the interconnections and/or wiring, wherein oxidation of the copper layer is avoided, even when removing the photoresist pattern, so as to reduce electrical resistance of the interconnections and/or wirings (as compared to interconnections and/or wirings having such copper oxide).

It is a further object of the present invention to provide a patterned copper layer, particularly a patterned copper layer utilized as an interconnection and/or wiring of a semiconductor device, wherein copper of such patterned copper layer has not been oxidized by oxidation of the copper layer during removal of photoresist by oxygen plasma treatment during formation of the patterned copper layer.

It is a further object of the present invention to provide such patterned copper layer (e.g., interconnections and/or wirings), oxidation of which has been avoided, as discussed previously, and which is substantially non-tapered with reduced line width and reduced spacing between adjacent layer portions, and wherein etching of a material (for example, an insulating layer) on which the patterned copper layer is provided is avoided.

The above and other objects and novel features of the present invention will become apparent from the description in this specification and the accompanying drawings.

Generally, the above objective of avoiding oxidation of the copper layer is achieved through use of an etching mask layer and an anti-oxidizing layer in forming the patterned copper layer, with the copper layer being covered with one of such layers at the time of removing the photoresist pattern by oxygen plasma treatment. By having the copper film covered with the lowermost of the anti-oxidizing and etching mask layers at the time of removal of the photoresist pattern, oxidation of the copper layer during the oxygen plasma treatment can be avoided.

Thus, generally, in the process of the present invention, anti-oxidizing and etching mask layers are stacked on a copper layer, prior to forming the patterned photoresist. After forming the patterned photoresist on the uppermost of the anti-oxidizing and etching mask layers, the uppermost of the anti-oxidizing and etching mask layers is etched using the patterned photoresist as a mask. Then, while the copper layer is still covered by the lower of the anti-oxidizing and etching mask layers, the patterned photoresist is removed (for example, by oxygen plasma treatment). Oxidation of the copper layer during removal of the patterned photoresist is avoided due to the copper layer being covered during such removal.

A typical procedure of the present invention will be briefly explained in the following. Of course, such technique is merely exemplary.

Namely, a procedure achieving objectives of the present invention comprises steps of:
(a) forming an anti-oxidizing layer on a copper layer;
(b) forming a layer for forming an etching etching mask layer), used to etch the anti-oxidizing layer, on the anti-oxidizing layer;
(c) forming a photoresist pattern (for example, by conventional photolithography) on the layer for forming an etching mask;
(d) etching the layer for forming an etching mask, using the photoresist pattern as a mask, to thereby form the etching mask;
(e) removing the photoresist pattern by an oxygen plasma treatment;
(f) etching the anti-oxidizing layer using the etching mask; and
(g) etching the copper layer using the etched anti-oxidizing layer and etching mask as a mask to thereby form a patterned copper layer.

Further objectives of the present invention are achieved by utilizing reactive ion etching for etching the copper layer, in forming the patterned copper layer. By utilizing reactive ion etching to etch the copper layer, a final product having a profile wherein the patterned copper layer has substantially non-tapered side walls can be achieved. Particularly by utilizing a high temperature reactive ion etching (wherein the substrate is maintained at a temperature of 200°-500° C.), with the reactive ion etching being performed utilizing a chlorine-containing gas, a patterned copper layer satisfying the objectives of the present invention can be achieved.

Further objectives of the present invention can be achieved by utilizing the patterned copper layer, as a wiring layer and/or interconnection, on a semiconductor substrate, as part of a semiconductor device, such as an integrated circuit device (e.g., LSI). Desirably, the semiconductor substrate can include semiconductor elements, such as bipolar transistors and/or field effect transistors (FET's), the interconnections and/or wiring layers being provided as a single layer or multi layer wiring structure provided on the semiconductor substrate, in providing semiconductor devices having high integration density.

The product of the present invention (that is, the patterned copper layer) includes at least a residue of the etch mask layer. Thus, standard material profile analysis techniques, such as SIMS analysis or Auger Electron Spectroscopy, for example, show at least a residue of the material of the etch mask layer in the final product. Of course, in some instances a film of the etch mask material layer will be retained in the final product. The final product also can include the anti-oxidizing layer.

Particularly when the etching of the copper layer is provided by RIE, especially relatively high temperature (e.g. 200° C.-500° C.) RIE, a patterned copper layer is formed having sides which are substantially non-tapered (for example, which are substantially perpendicular to the substrate on which the patterned copper layer is provided). Moreover, when utilizing the preferred RIE to etch the copper layer, a patterned copper layer with lines and spaces less than 1 $\mu$m, and with substantially no etching of the substrate on which the patterned copper film is provided, can be achieved. Such patterned copper layer is particularly desirable as interconnections and/or wirings of a semiconductor device, provided on a semiconductor substrate having semiconductor elements provided therein. In particular, by providing wirings and/or interconnections wherein the lines and spaces are less than 1 $\mu$m in width, the density of the semiconductor device can be increased.

Accordingly, by the present invention, a patterned copper layer can be provided utilizing a patterned photoresist to form the patterned copper layer, with the patterned photoresist removed by an oxygen plasma treatment, without oxidation of the copper film. Accordingly, where such patterned copper film is utilized as a wiring and/or interconnection of a semiconductor device, such wiring and/or interconnection can be provided without increased resistance caused by oxidation of the copper. In addition, by the present invention, particularly wherein the patterned copper film is formed (by etching) by reactive ion etching, a product with decreased line widths and spaces, and with substantially no etching of the substrate, while avoiding oxidation of the patterned copper layer, can be achieved.

DETAILED DESCRIPTION OF THE INVENTION

Figure 1:
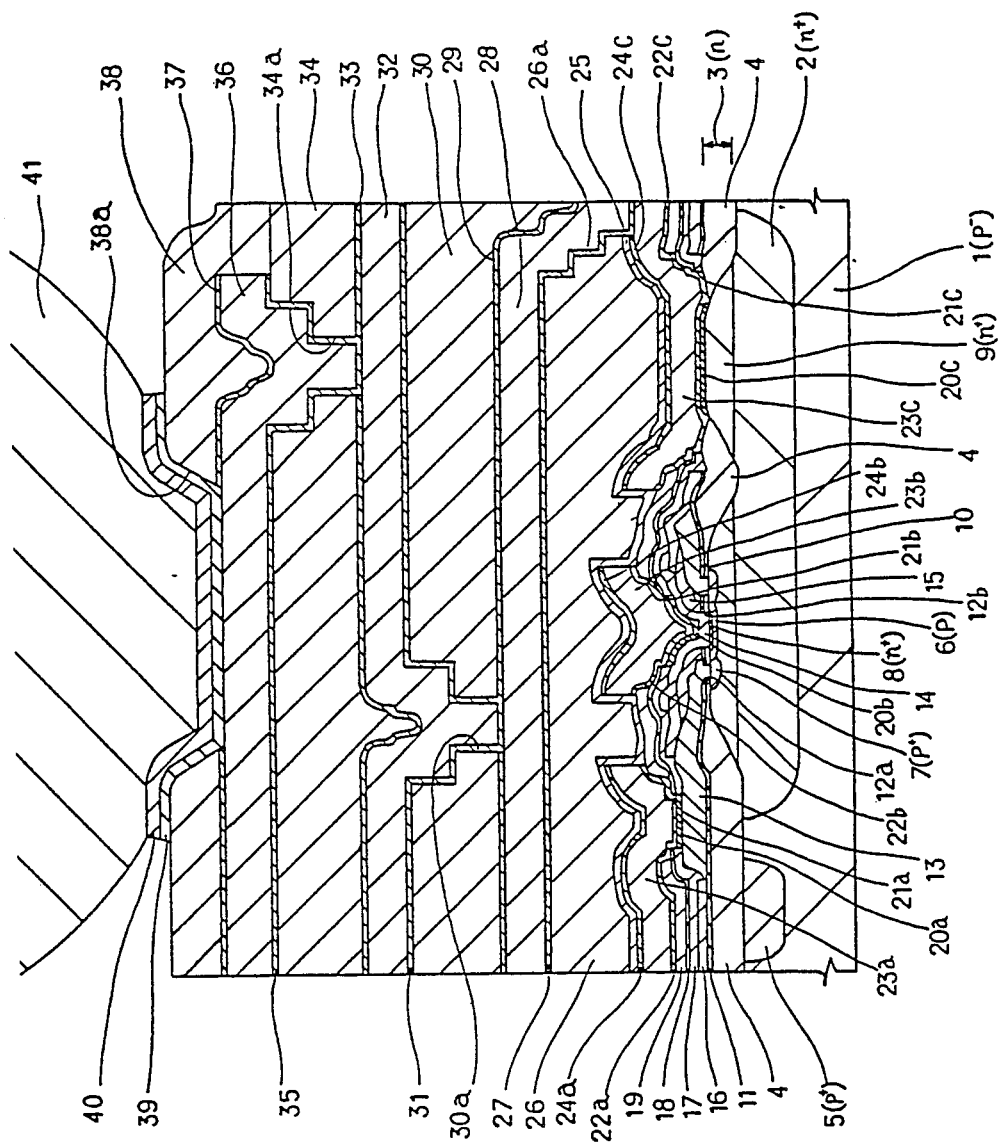
FIG. 1 is a sectional view showing part of a LSI, including a bipolar transistor, according to one embodiment of the present invention.

While the invention will be described in connection with specific and preferred embodiments, it will be understood that it is not intended to limit the invention to those specifc and preferred embodiments. To the contrary, it is intended to cover all alterations, modifications and equivalents as may be included within the spirit and scope of the invention as defined by the appended claims.

Briefly, the present invention contemplates a process for forming a patterned copper layer, and product formed by such process, wherein in the process anti-oxidizing and etching mask layers are utilized; and wherein, in stripping a photoresist pattern by oxygen plasma treatment, a copper layer is covered with the lowermost of the anti-oxidizing and etching mask layers so as to avoid oxidation of the copper layer during the photoresist stripping step.

The process of the present invention involves a step of forming a copper layer on a substrate. However, where the substrate is, for example, silicon oxide or silicon, a barrier layer (such as TiN) is provided on such substrate, interposed between the substrate and copper layer. This barrier layer avoids migration of copper into the substrate, as described in the aforementioned Extended Abstracts, discussed in connection with the background of the present invention. Thereafter, the copper layer is provided on the barrier layer; thereafter, anti-oxidizing and etching mask layers are provided on the copper layer. Then, a photoresist film is provided on the uppermost of the anti-oxidizing and etching mask layers, with such photoresist being patterned by conventional photolithography to provide the desired patterned photoresist. Thereafter, the uppermost of the anti-oxidizing and etching mask layers is etched, utilizing the patterned photoresist as a mask. Then, the photoresist pattern is removed utilizing conventional oxygen plasma treatment to strip away the patterned photoresist. During this oxygen plasma treatment, the copper layer is completely covered with the lowermost of the anti-oxidizing and etching mask layers, so that oxidation of the copper during the oxygen plasma treatment for stripping the photoresist is avoided. Thereafter, utilizing the etched uppermost layer as a mask, the other of the anti-oxidizing and etching mask layers is etched; and, thereafter, the copper layer is etched using the patterned anti-oxidizing and/or etching mask layers as a mask. Then, the lower barrier layer can be etched using the patterned anti-oxidizing and/or etching mask layers as a mask, so as to provide the patterned structure, including the patterned copper layer.

As is clear from the foregoing, a barrier layer (of, for example, TiN) is provided between the copper layer and the substrate, so as to prevent migration of copper into the substrate. Where the copper will migrate into the etch mask layer during subsequent treatment after forming the copper and etch mask layers, it is preferred that the anti-oxidizing layer be provided between the copper layer and etching mask layer. For example, where aluminum is utilized as material for the etching mask layer, the anti-oxidizing layer must also act as a barrier layer between the aluminum and copper layers, to prevent migration of copper into the aluminum. Thus, after providing the copper layer the anti-oxidizing layer is provided on the copper layer, with the etching mask layer being provided on the anti-oxidizing layer. By using a material providing a barrier to migration of copper into the etching mask layer, for the anti-oxidizing layer, any increase in electrical resistance of the copper layer, due to such migration, can be avoided.

However, where there would be no copper migration into the etch mask layer, the etch mask layer can be provided below the anti-oxidizing layer (that is adjacent the copper), rather than above the anti-oxidizing layer.

In the following Table 1, there is disclosed various exemplary materials which can be utilized for the anti-oxidizing layer and for the etching mask layer. Where Al is indicated as a material for the etching mask layer, we also include Al-Si alloys and Al-Cu-Si alloys.

TABLE 1

| Anti-oxidizing Layer Materials | Etching Mask Layer Materials |
|---|---|
| TiN, TaN, NbN | Al, Si, Ga, Sn |
| ZrN, VN, Cr | Mo, $MoSi_2$, W, $WSi_2$, $SiO_2$ |

Of the materials listed in the foregoing Table 1, copper will not migrate into $MoSi_2$, W and $WSi_2$ under the processing conditions utilized in connection with the present invention. Accordingly, such materials, when utilized for the etching mask layer, can be provided adjacent to the copper layer. Moreover, these three specified materials can also be utilized as the anti-oxidizing layer according to the present invention. With respect to each of the other etching mask layer materials listed in Table 1, one of the anti-oxidizing layer materials must be provided between the copper layer and etching mask layer, to act as a barrier layer so as to avoid migration of copper into the etching mask layer.

Of course, where one of the three above-listed materials for the etching mask layer is utilized for the anti-oxidizing layer, as described above, it is required that the anti-oxidizing layer and etching mask layer together have sufficient selectivity to etching, as compared to the copper layer, so as to provide the required masking of desired portions of the copper layer during etching of the copper layer, while still providing coverage of the copper layer during the oxygen plasma treatment for stripping the photoresist, as discussed previously.

Each of the anti-oxidizing and etching mask layers can be deposited by conventional techniques. For example, where TiN is utilized as the anti-oxidizing layer, such titanium nitride can be deposited by reactive sputtering, in an atmosphere of argon and nitrogen, using a target of titanium. In such procedure, the titanium is sputtered off the target and deposited as titanium nitride, due to the nitrogen in the sputtering atmosphere. The etching mask layer can be formed by conventional sputtering. While the above-mentioned specific techniques for depositing the anti-oxidizing and etching mask layers are preferred, other standard techniques for depositing the layers can be utilized.

Illustratively, the anti-oxidizing film is thicker than 0.5 $\mu$m. Particularly where such anti-oxidizing film is TiN, such film must be relatively thick because the selectivity between it and copper for etching is relatively poor. The anti-oxidizing film can be etched as done conventionally; illustratively, a flourine gas can be utilized in a dry etching technique, in etching the anti-oxidizing film.

Illustratively, the etching mask layer is greater than 0.1 $\mu$m thick, and is etched utilizing conventional etching techniques.

The lower barrier layer (for example, TiN layer) between the copper layer and the substrate is formed so as to have a thickness greater than 0.1 $\mu$m. Where TiN is used for the lower barrier layer, it can be formed by reactive sputtering, as discussed previously with respect to use of TiN for the anti-oxidizing layer. By providing such layer with a thickness of at least 0.1 $\mu$m, migration of copper into the substrate (for example, either silicon or an insulating film such as silicon dioxide) can be avoided.

The copper layer, illustratively, has a thickness greater than 0.5 μm. Such copper film can be deposited by conventional deposition means; preferably, the copper is deposited by bias-sputtering, so as to form a dense copper layer.

Illustratively, the copper can be etched by conventional etching techniques; however, desirably a reactive ion etching at relatively high temperatures (that is, at temperatures of 200° C.-500° C.) is utilized to etch the copper. Such high temperature RIE etching is performed in a gas containing chlorine, such as $Cl_2$, $BCl_3$, $SiCl_4$, $CCl_4$, or mixtures of these gasses. The RIE technique utilized causes chlorine to react with the copper of the copper layer; moreover, at the relatively high temperatures of 200° C.-500° C., the copper chloride formed is volatilized, so as to provide etching of the copper layer.

Except for the relatively high temperatures of the RIE treatment of the copper layer, conventional RIE processing parameters and apparatus are utilized. Specifically, conventional apparatus for RIE treatment can be utilized, except that the, e.g., wafer having the copper layer, which is subjected to the RIE, is positioned on a susceptor (made of $Al_2O_3$, SiC or $SiO_2$, for example) which is heated (by resistance heating, for example) so as to provide the relatively high temperatures of 200° C.-500° C. Otherwise, the pressures utilized in the RIE apparatus, in the copper etch, are conventional; desirably, a pressure of 0.1 mTorr to 10 mTorr is utilized in the RIE procedure for etching copper, so as to avoid undercutting the copper.

The high temperature RIE copper etch can be performed by alternative techniques. In the first technique, the susceptor (and wafer) is heated to 200° C.-500° C., whereby simultaneously the chlorine reacts with the copper to form copper chloride and such copper chloride is volatilized away.

In a second technique, a two-step procedure is utilized. In the first step, the chlorine in the atmosphere is caused to react with the copper, during a first RIE step, so as to form the copper chloride; such first step can be performed at a temperature less than 100° C., whereby the copper chloride does not volatilize off. Then, in a second step, lamp annealing is performed (for example, at 4 kW/wafer for 10 seconds-2 minutes) so as to raise the temperature of the wafer to around 200° -500° C., so as to volatilize off the copper chloride. This second method is preferred, because it provides a very clean final product with no contamination. In this second method, it is preferred to utilize pure $Cl_2$ as the gas in the RIE apparatus, for forming the copper chloride.

Figure 7:
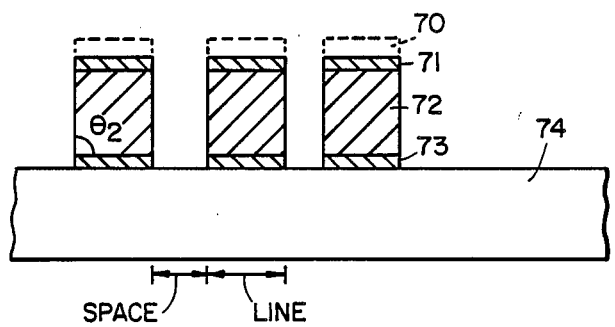
FIG. 7 shows the patterned layered structure achieved according to the present invention.

FIG. 7 shows the product produced by the present invention, utilizing relatively high temperature RIE for etching the copper. This FIG. 7 shows three patterned copper layer portions, each portion having a barrier layer (e.g., TiN) 73, copper layer 72, and anti-oxidizing layer 71. Also shown, in dotted lines, is etching mask layer 70. As can be appreciated from FIG. 7, the side walls of the copper are nontapered (that is, $\theta_2$ is approximately 90° C.). Moreover, there is substantially no etching of the underlayer 74 (for example, silicon oxide underlayer).

In addition, since the sides of the copper layer 72, after etching, are substantially non-tapered, it becomes possible to locate the patterned copper layers closely adjacent to each other, and such patterned films can be made relatively small (for example, the patterned copper layers can be spaced less than 1 μm, with such patterned layers having a line width less than 1 μm). Accordingly, by the present process submicron wiring layers and interconnections can be achieved.

During etching of the copper layer, and where etching mask layer is provided on an anti-oxidizing layer (of TiN, for example) provided between the copper layer and etching mask layer, it is possible that the material of the etching mask layer is etched during etching of the copper layer. However, even where such etching mask layer is etched, it is possible to detect the etching mask material in the final product. Thus, the final product would contain at least atoms of the material of the etching mask as etching mask residue, and may even contain a remaining film of such etching mask material. In this regard, note the following Table 2, showing materials for the etching mask layer, and the remaining portion thereof after etching of the copper layer.

TABLE 2

| Etching mask layer materials | What remains of etching mask layer after etching layers thereunder |
|---|---|
| Al, Si, Mo, $MoSi_2$, W, $WSi_2$ | Atoms of etching mask layer material (as residue), or film |
| Ga, Sn, $SiO_2$ | film |

As is clear on the foregoing Table 2, the final product according to the present invention can include not only the anti-oxidizing layer, but also at least residue of the etching mask layer materials.

In the following, a specific illustrative embodiment of the present invention will be set forth. Of course, the present invention is not limited thereto.

EMBODIMENT

One embodiment of the present invention will be described hereinunder specifically with reference to FIGS. 1-5. It should be noted that, throughout these FIGS. 1-5 used to describe this embodiment, elements or portions having the same functions are denoted by the same reference numerals, and repetitive description thereof is omitted.

Due to the convenience of description, the structure of a LSI having a bipolar transistor, produced by a process according to this embodiment of the present invention, will be explained.

As shown in FIG. 1, in the LSI having a bipolar transistor, according to this embodiment, a buried layer 2 of, for example, the n+-type, is provided on the surface of a semiconductor substrate 1, for example, a p−-type silicon substrate, and an epitaxial layer 3, for example, an n-type silicon epitaxial layer, is provided on the substrate 1. A field insulating film 4, for example, an $SiO_2$ film, is provided on predetermined portions of the epitaxial layer 3, thereby effecting isolation between elements and isolation within each element. A channel stopper region 5 of, for example, the p+-type, is provided underneath the field insulating film 4. Within the epitaxial layer 3 surrounded by the field insulating film 4 are provided an intrinsic base region 6 of, for example, the p-type, and a graft base region 7 of, for example, the p+-type. An emitter region 8 of, for example, the n+-type, is provided within the intrinsic base region 6. The emitter region 8, the intrinsic base region 6 and a collector region which comprises the respective regions of the epitaxial and buried layers 3, 2 which are underneath the intrinsic base region 6 constitute in combination a npn bipolar transistor.

The reference numeral 9 denotes a collector lead-out region of, for example, the n+-type, which is connected to the buried layer 2. The reference numeral 10 denotes an insulating film, for example, an SiO2 film, which is provided continuously with the field insulating film 4. The reference numeral 11 denotes an insulating film, for example, an Si3N4 film. These insulating films 10 and 11 are provided with openings 12a and 12b in correspondence with the graft base region 7 and the emitter region 8, respectively. A base lead-out electrode 13 which is defined by a polycrystalaline silicon film is connected to the graft base region 7 through the opening 12a, and a polycrystalline silicon emitter electrode 14 doped with an n-type impurity, for example, arsenic, is provided on the emitter region 8 through the opening 12b. The reference numerals 15, 16 and 17 denote insulating films, for example, SiO2 films, while the numeral 18 denotes an insulating film, for example, an Si3N4 film, and the numeral 19 denotes an insulating film, for example, a PSG film.

The reference numerals 20a, 20b, 20c denote metal silicide films, for example, platinum silicide (PtSi2) films, which are provided on the base lead-out electrode 13, the polycrystalline silicon emitter electrode 14 and the collector lead-out region 9 at openings 21a, 21b and 21c provided in the insulating films 17 and 18. The reference numerals 22a, 22b and 22c denote TiN films by way of example. First-level copper interconnections 23a, 23b and 23c are provided on the TiN films 22a, 22b and 22c, respectively. The metal silicide films 20a, 20b and 20c and the TiN films 22a, 22b, 22c enable prevention of the reaction between the base lead-out electrode 13, the polycrystalline silicon emitter electrode 14 and the collector lead-out region 9 on the one hand and the copper interconnections 23a, 23b and 23c on the other. The TiN films 22a, 22b and 22c further enable an improvement in the adhesion of the copper interconnections 23a, 23b and 23c to the underlying insulating film 19. It is known that the resistance of the copper interconnections 23a, 23b and 23c is increased by external diffusion of an impurity, e.g., phosphorus (P), boron (B) or the like. However, since the TiN films 22a, 22b and 22c prevent diffusion of such an impurity, it is possible to prevent an increase in the resistance of the interconnections due to the diffusion of the impurity contained in the underlying insulating film 19 into the copper interconnections 23a, 23b and 23c during a subsequent heat treatment after forming the copper layer.

The reference numerals 24a, 24b and 24c denote anti-oxidizing films, for example, TiN films. The numeral 25 denotes an impurity diffusion preventing film which is defined by an insulating film such as a silicon nitride film formed by plasma CVD, an SiO film formed by plasma CVD or an alumina (Al2O3) film. Like the TiN films 22a, 22b and 22c, the diffusion preventing film 25 enables prevention of an increase in the interconnection resistance due to the diffusion of the impurity contained in an interlayer insulating film 26 (described later) into the copper interconnections 23a, 23b and 23c during a heat treatment.

The reference numeral 26 denotes a first-level interlayer insulating film, for example, an SiO2 film formed by bias sputtering of SiO2. A TiN film 27, for example, is provided on the interlayer insulating film 26, and a second-level copper interconnection 29 is provided on the TiN film 27. Like the TiN films 22a, 22b and 22c, the TiN film 27 enables an improvement in the adhesion of the copper interconnection 28 to the underlying interlayer insulating film 26. The copper interconnection 28 is connected to the copper interconnection 23c through a through-hole 26a provided in the interlayer insulating film 26. It should be noted that the through-hole 26a has a staircase-shaped configuration whereby it is possible to improve the step coverage of the copper interconnection 28 at the through-hole 26a. A technique for forming such stair case configuration is described in U.S. application Ser. No. 117,855, filed Nov. 6, 1987, the contents of which are incorporated herein by reference. The reference numeral 29 denotes an anti-oxidizing film, for example, a TiN film.

The reference numeral 30 denotes a second-level interlayer insulating film which comprises, for example, an SiO film formed by plasma CVD, a spin-on-glass (SOG) film and an SiO film formed by plasma CVD. A TiN film 31, for example, is provided on the interlayer insulating film 30, and a third-level copper interconnection 32 is provided on the TiN film 31. The TiN film 31 enables an improvement in the adhesion of the copper interconnection 32 to the underlying interlayer insulating film 30. The copper interconnection 32 is connected to the copper interconnection 28 through a through-hole 30a provided in the interlaYer insulating film 30. It should be noted that the through-hole 30a has a staircase-shaped configuration similar to that of the through-hole 26a, whereby it is possible to improve the step coverage of the copper interconnection 32 at the through-hole 30a, which staircaseshaped configuration can be formed as described in the previously mentioned application Ser/ No. 117,855. The reference numeral 33 denotes an anti-oxidizing film, for example, a TiN film.

The reference numeral 34 denotes an interlayer insulating film having a structure similar to that of the interlayer insulating film 30. A TiN film 35, for example, is provided on the interlayer insulating film 34, and a fourth-level copper interconnection 36 is provided on the TiN film 35. The TiN film 35 enables an improvement in the adhesion of the copper interconnection 36 to the underlying interlayer insulating film 34. The copper interconnection 36 is connected to the copper interconnection 32 through a through-hole 34a provided in the interlayer insulating film 34. It should be noted that the through-hole 34a has a staircase-shaped configuration similar to those of the through-holes 26a and 30a, whereby it is possible to improve the step coverage of the copper interconnection 36 at the through-hole 34a. The reference numeral 37 denotes an anti-oxidizing film, for example, a TiN film.

The reference numeral 38 denotes a protection film, for example, an SiO2 film. The protection film 38 is provided with an opening 38a through which a Cr film 39, for example, is provided on the copper interconnection 36. A bump 41 which is made of, for example, a lead (Pb)-tin (Sn) alloy solder, is provided on the Cr film 39 through a layer 40 made of, for example, a copper (Cu)-tin (Sn) intermetallic compound.

The following is a description of a process for producing the bipolar LSI arranged as described above.

Figure 2:
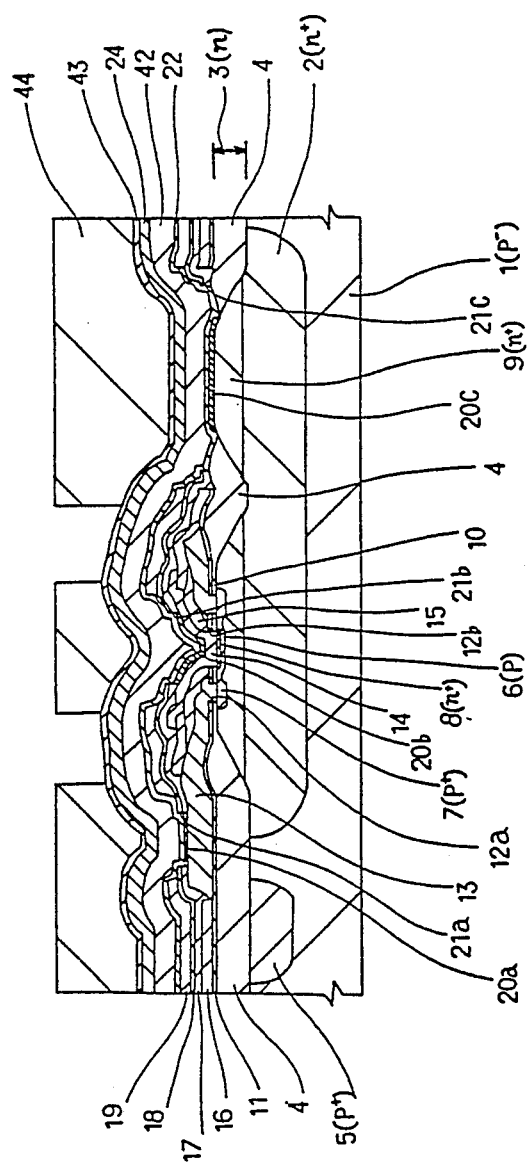
FIGS. 2-5 are sectional views for illustrating successive steps in producing the LSI, including the bipolar transistor, according to this first embodiment of the present invention.

First, the manufacturing steps are carried out in the same way as in the manufacturing process described in Japanese Patent Publication No. 55-27469 (1980), the contents of which is incorporated herein by reference, to form an insulating film 19 and openings 21a, 21b, 21c, as shown in FIG. 2. Next, metal silicide films 20a, 20b and 20c are formed on a base lead-out electrode 13, a polycrystalline silicon emitter electrode 14 and a collector lead-out region 9 at the openings 21a, 21b and 21c, respectively. Thereafter, a TiN film 22 having a thickness of, for example, about 1000 to 2000Å, is formed on the whole surface by, for example, reactive sputtering. Next, a copper film 42 having a thickness of, for example, 1 μm, is formed on the TiN film 22 by, for example, sputtering, and an anti-oxidizing film 24, for example, a TiN film having a thickness of 5000Å, is formed on the copper film 42. It should be noted that, for example, a Ti boride film may also be employed as the anti-oxidizing film 24. Next, a film 43 for forming an etching mask, for example, an aluminum (Al) film, which enables selective etching with respect to the anti-oxidizing film 24 is formed by, for example, sputtering. The thickness of the film 43 is set at, for example, 1000Å. It should be noted that it is also possible to employ as the film 43 a film of molybdenum (Mo), MoSi$_2$, tungsten (W), WSi$_2$, SiO$_2$ or the like. Thereafter, a photoresist pattern 44 having a predetermined configuration is formed on the film 43 by conventional photolithography.

Figure 3:
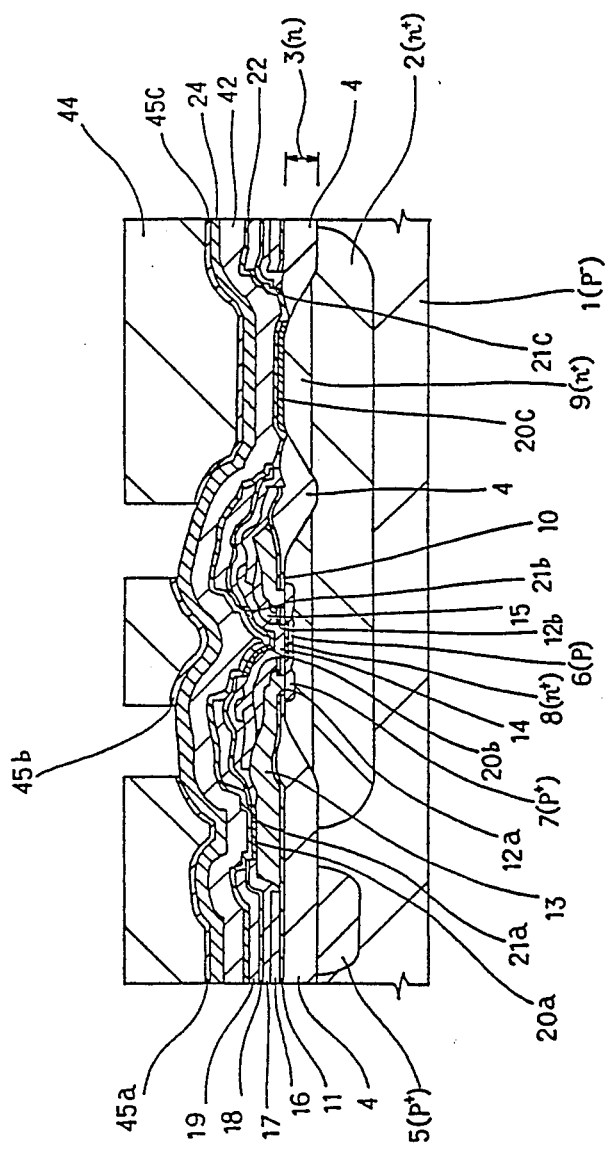
Figure 4:
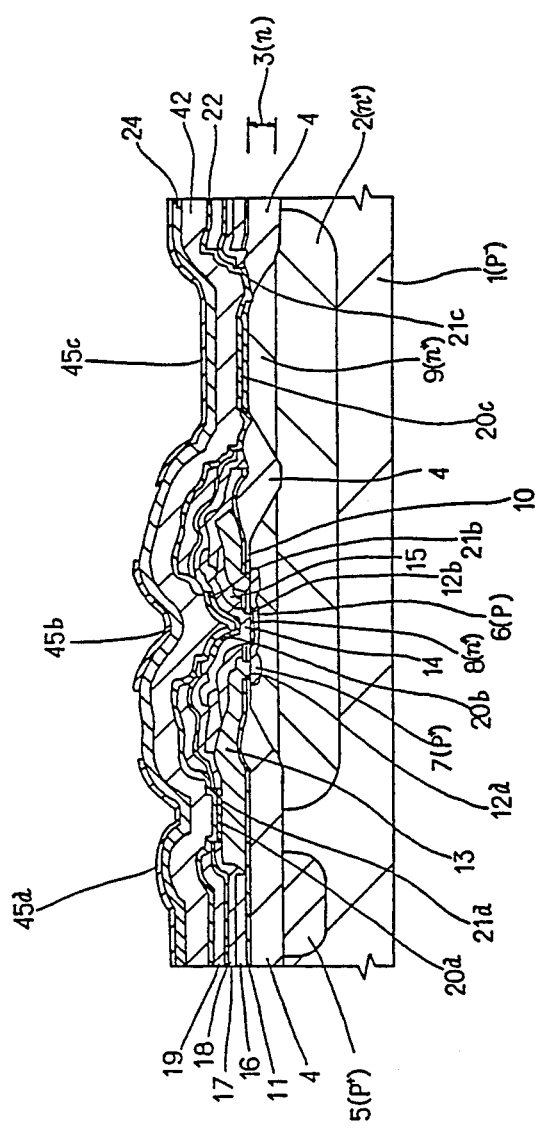

Next, with the photoresist pattern 44 used as a mask, the film 43 is etched by RIE using, for example, a chlorine (Cl) etching gas (e.g., Cl$_2$, BCl$_3$, CCl$_4$ or the like). Thus, etching masks 45a, 45b and 45c are formed as shown in FIG. 3.

Next, the photoresist pattern 44 is removed by an oxygen plasma treatment (shown in FIG. 4), as conventionally used to remove photoresist patterns. During the oxygen plasma treatment, the surface of the copper film 42 is completely covered with the anti-oxidizing film 24, and therefore it is possible to effectively prevent oxidation of the copper film 42. Thus, it is possible to form low-resistance copper interconnections 23a, 23b and 23c, as described later.

Figure 5:
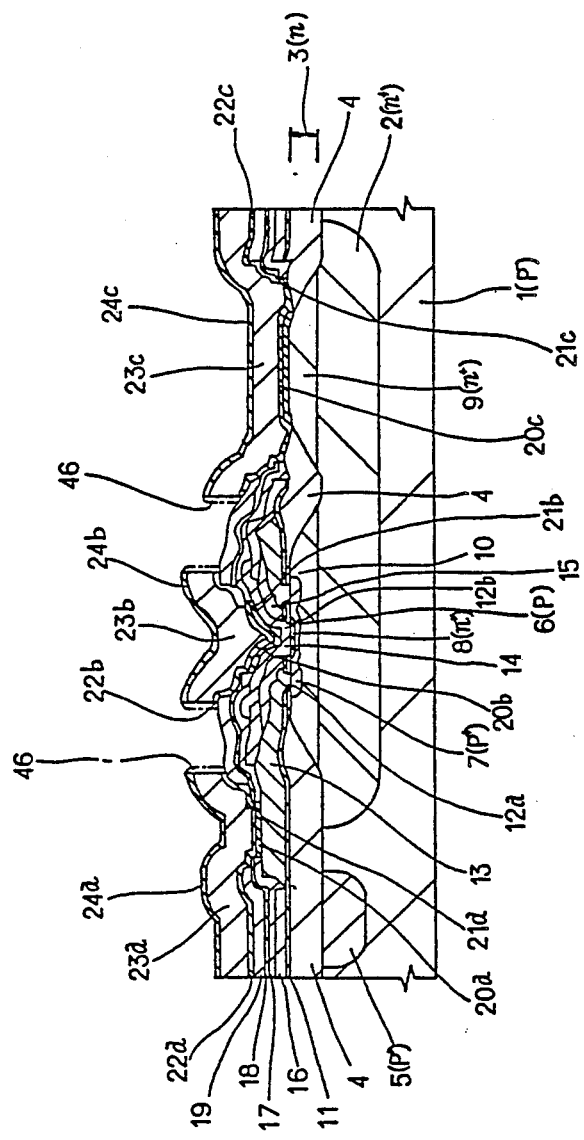
Figure 6:
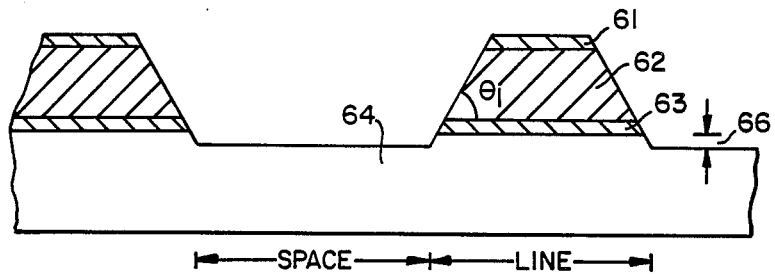
FIG. 6 shows a sectional view of a patterned layered structure including a patterned copper layer provided by a conventional technique.

Next, with the etching masks 45a, 45b and 45c, the anti-oxidizing film 24 is etched by RIE using, for example, a fluorine (F) etching gas (e.g., CF$_4$, CHF$_3$, CH$_2$F$_2$ or the like). As a result, anti-oxidizing films 24a, 24b and 24c having predetermined configurations are formed as shown in FIG. 5. Next, with these anti-oxidizing films 24a, 24b and 24c used as etching masks, the copper film 42 is etched at a temperature of, for example, 200° to 500° C., by RIE using, for example, a Cl etching gas (e.g., Cl$_2$, BCl$_3$, CCl$_4$ or the like), thereby forming copper interconnections 23a, 23b and 23c. It should be noted that the etching masks 45a, 45b and 45c are also substantially removed during this etching, but a residue remains. Next, with the copper interconnections 22a, 23b and 23c used as etching masks, the TiN film 22 is etched by RIE using, for example, a fluorine etching gas, thereby forming TiN films 22a, 22b and 22c having predetermined configurations.

Next, as shown in FIG. 1, a diffusion preventing film 25 and an interlayer insulating film 26 are formed on the whole surface, and predetermined portions of these films are then removed by etching to form a through-hole 26a. Next, a TiN film 27, a copper film and an anti-oxidizing film 29 are formed on the whole surface and then etched to form a second-level copper interconnection 28 in a manner similar to that employed to form the first-level copper interconnections 23a, 23b and 23c. Next, a second-level interlayer insulating film 30 is formed and a predetermined portion thereof is then removed by etching to form a through-hole 30a. Next, a TiN film 31, a copper film and an anti-oxidizing film 33 are formed on the whole surface and then etched in a manner similar to the above to form a third-level copper interconnection 32. Next, a third-level interlayer insulating film 34 is formed and a predetermined portion thereof is then removed by etching to form a through-hole 34a. Next, a TiN film 35, a copper film and an anti-oxidizing film 37 are formed on the whole surface and then etched in a manner similar to the above to form a fourth-level copper interconnection 36.

Next, a protection film 38 is formed and a predetermined portion thereof is then removed by etching to form an opening 38a, thereby exposing the surface of the interconnection 36 through the opening 38a. In this state, a Cr film 39, a Cu film (not shown) and an Au film (not shown) are successively formed on the whole surface by, for example, evaporation. Thereafter, the Au film, the Cu film and the Cr film 40 are patterned in a predetermined configuration by etching. in this case, the Au film is provided for the purpose of preventing oxidation of the Cu film, while the Cu film is provided for ensuring solderability of a solder bump 41 to the ground. It should be noted that the Au film, the Cu film and the Cr film 39 are generally known as "BLM (Ball Limiting Metallization)." Next, Pb and Sn films (not shown) having a predetermined configuration are formed by, for example, the lift-off method, so that the Pb and Sn films cover the Au, Cu and Cr films, and a heat treatment is then carried out at a predetermined temperature. Thus, the Pb and Sn films are alloyed with each other, resulting in a substantially spherical Pb-Sn alloy solder bump 41. During this alloying, Sn in the Sn film is alloyed with Cu in the Cu film to form a Cu-Sn intermetallic compound layer 40 between the solder bump 41 and the Cr film 39. In this way, the target LSI having a bipolar transistor is completed.

Although the present invention has been described above specifically by way of one embodiment, it should be noted that the present invention is not limited to the above-described embodiment and various changes and modifications may, of course, be imparted thereto without departing from the gist of the present invention.

Further to Table 1 of this specification, for example, as the anti-oxidizing film a film of a nitride or boride of a metal such as zirconium (Zr), vanadium (V), tantalum (Ta), niobium (Nb) and Cr, or pure chromium, may be employed. In this case, the following etching gases may be employed for etching these nitride and boride films: for nitrides or borides of Zr and V, Cl$_2$, BCl$_3$, CCl$_4$ or the like; for nitrides or the like; for nitrides or borides of Ta and Nb, CF$_4$, CHF$_3$, SF$_6$, NF$_3$ or the like; and for a nitride or boride of Cr, Cl$_2$, BCl$_3$, CCl$_4$ or the like. The following etching masks may be employed for these nitride and boride films: for nitrides or borides of Zr, V and Cr, Mo, MoSi$_2$, W, WSi$_2$, SiO$_2$ or the like; and for nitrides or borides of Ta and Nb, Al, Si, gallium (Ga), Sn or the like.

Further, the arrangement may be such that, as shown in FIG. 5, after the anti-oxidizing films 24a, 24b and 24c have been formed, an anti-oxidizing film 46, for example, a TiN film, is further formed on the whole surface, and the anti-oxidizing film 46 is subjected to an anisotropic etching by, for example, RIE, to cover the side surfaces of the copper interconnections 23a, 23b and 23c with the anti-oxidizing film 46. Thus, since the copper interconnections 23a, 23b and 23c are completely covered with the anti-oxidizing films 24a, 24b, 24c and 46, it is possible to prevent oxidation of the copper interconnections 23a, 23b and 23c during the manufacturing steps carried out thereafter.

Although in the above-described embodiment the present invention is applied to an LSI having a four-layer copper interconnection structure, the present invention may be applied irrespective of the number of layers constituting the copper interconnection structure. Further, the present invention may also be applied to various kinds of semiconductor integrated circuit devices having copper interconnections besides LSI's with bipolar transistors.

By the present invention, it is possible to prevent oxidation of the copper film when the photoresist pattern is removed by an oxygen plasma treatment.

While we have shown and described embodiments in accordance with the present invention, it is understood that the same is not limited thereto but is susceptible of numerous changes and modifications as known to one having ordinary skill in the art, and we, therefore, do not wish to be limited to the details shown and described herein, but intend to cover all such modifications as are encompassed by the scope of the appended claims.

What is claimed is:

1. A process for producing a patterned copper layer, comprising the steps of:
    (a) forming etching mask and anti-oxidizing layers on a copper layer, such that the anti-oxidizing layer is provided on the copper layer and the etching mask layer is provided on the anti-oxidizing layer;
    (b) forming a patterned photoresist layer on said etching mask layer;
    (c) etching the etching mask layer using the patterned photoresist layer as a mask, so as to form an etched etching mask layer;
    (d) removing the patterned photoresist layer, the copper layer being covered with the anti-oxidizing layer during removal of the patterned photoresist layer;
    (e) after removing the patterned photoresist layer, etching the anti-oxidizing layer using the etched mask layer as a mask, so as to expose portions of the copper layer; and
    (f) etching the exposed portions of the copper layer so as to form the patterned copper layer.

2. A process according to claim 1, wherein the patterned photoresist layer is removed by an oxygen plasma treatment.

3. A process according to claim 1, wherein the anti-oxidizing layer is made of a material preventing migration of copper of the copper layer into the etching mask layer, such that the anti-oxidizing layer acts as a barrier to migration of copper from the copper layer into the etching mask layer.

4. A process according to claim 3, wherein the anti-oxidizing layer is formed of TiN.

5. A process according to claim 4, wherein the etching mask layer is formed of Al.

6. A process according to claim 1, wherein the anti-oxidizing layer is formed of TiN.

7. A process according to claim 1, wherein the copper layer is provided over a substrate, the substrate is made of a material into which copper of the copper layer can migrate, and wherein a barrier layer is provided between the substrate and the copper layer to prevent migration of copper from the copper layer into the substrate.

8. A process according to claim 7, wherein said barrier layer is formed of TiN.

9. A process according to claim 7, wherein said substrate is a semiconductor substrate having an insulating layer thereon, the copper layer being provided on the insulating layer.

10. A process according to claim 9, wherein the semiconductor substrate has semiconductor elements formed therein, whereby an integrated circuit device is provided, the patterned copper layer constituting at least one of a wiring layer and an interconnection of said integrated circuit device.

11. A process according to claim 10, wherein the exposed portions of the copper layer are etched by reactive ion etching.

12. A process according to claim 11, wherein the reactive ion etching is performed at a temperature of 200° C.–500° C.

13. A process according to claim 12, wherein the reactive ion etching is performed using a chlorine etching gas.

14. A process according to claim 13, wherein the etching of the etching mask layer is performed using a chlorine etching gas.

15. A process according to claim 14 wherein the etching of the anti-oxidizing layer is performed using a fluorine etching gas.

16. A process according to claim 10, wherein the semiconductor elements in the semiconductor substrate include a bipolar transistor, whereby an integrated circuit bipolar transistor device is formed.

17. A process according to claim 10, wherein said copper layer is the fourth copper layer over the semiconductor substrate, the first three copper layers constituting respective interconnection or wiring layers of the integrated circuit device.

18. A process according to claim 17, wherein a solder bump is formed on the fourth copper layer.

19. A process according to claim 1, wherein the exposed portions of the copper layer are etched by reactive ion etching to form the patterned copper layer.

20. A process according to claim 19, wherein the reactive ion etching is performed at a temperature of 200° C.–500° C.

21. A process according to claim 20, wherein the reactive ion etching is performed in a single step, in a chlorine-containing atmosphere, at the temperature of 200° C.–500° C.

22. A process according to claim 19, wherein said reactive ion etching is performed in a chlorine-containing atmosphere.

23. A process according to claim 22, wherein the chlorine-containing atmosphere includes at least one chlorine-containing gas selected from the group consisting of $Cl_2$, $BCl_3$, $SiCl_4$ and $CCl_4$.

24. A process according to claim 22, wherein the reactive ion etching is performed in a two-step procedure, a first step in which chlorine in the atmosphere is caused to react with copper of the copper layer, so as to form copper chloride; and a second step, at a temperature between 200°–500° C., whereby the copper chloride is volatilized off.

25. A process according to claim 24, wherein said first step of the reactive ion etching is performed at a temperature such that the copper chloride does not volatilize off.

26. A process according to claim 19, wherein the reactive ion etching is performed at a pressure of 0.1 mTorr to 10 mTorr, so as to substantially avoid undercutting copper of the copper layer.

27. A process according to claim 1, wherein the copper layer is substantially completely covered with the anti-oxidizing layer at the time of removing the patterned photoresist layer, so as to avoid oxidation of the copper layer when removing the patterned photoresist layer.

28. A process according to claim 1, wherein a material for the anti-oxidizing layer is selected from the group consisting of TiN, TaN, NbN, ZrN, VN and Cr, and a material for the etching mask layer is selected from the group consisting of Al, Si, Ga, Sn, Mo, MoSi$_2$, W, WSi$_2$ and SiO$_2$.

29. A process according to claim 1, wherein the anti-oxidizing layer has a thickness greater than 0.5 μm, the etching mask layer has a thickness greater than 0.1 μm, and the copper layer has a thickness greater than 0.5 μm.

30. A process according to claim 1, wherein a material for the anti-oxidizing layer is selected from the group consisting of a nitride or boride of Cr, and borides of Zr, V, Ta and Nb.

31. A process according to claim 1, comprising a further step, after etching the exposed portions of the copper layer, of forming a further anti-oxidation layer on exposed side surfaces of the patterned copper layer.

32. A process according to claim 31, wherein said further anti-oxidation layer and the anti-oxidation layer in combination completely cover the patterned copper layer.

33. A process according to claim 31, wherein said further anti-oxidation layer is formed by forming a film of material of the further anti-oxidation layer on the patterned copper layer, including on the exposed side surfaces thereof, and subjecting said film of material of the further anti-oxidation layer to anisotropic etching so as to leave the further anti-oxidation layer on the exposed side surfaces of the patterned copper layer.

34. A process for producing a semiconductor device having wiring layers and interconnections, comprising the steps of:
 (a) forming a copper layer over a semiconductor substrate having at least one semiconductor element therein;
 (b) forming etching mask and anti-oxidizing layers on said copper layer, such that the anti-oxidizing layer is provided on said copper layer and the etching mask layer is provided on the anti-oxidizing layer;
 (c) forming a patterned photoresist layer on said etching mask layer;
 (d) etching the etching mask layer using the patterned photoresist layer as a mask, so as to form an etched etching mask layer;
 (e) removing the patterned photoresist layer by an oxygen plasma treatment, the copper layer being covered with the anti-oxidizing layer during removal of the patterned photoresist layer;
 (f) after removing the patterned photoresist layer, etching the anti-oxidizing layer, so as to expose portions of the copper layer, using the etched etching mask layer as a mask; and
 (g) etching the exposed portions of the copper layer so as to form at least one of interconnections and wiring layers of the semiconductor device.

35. A process according to claim 34, wherein steps (a)-(g) are repeated at least once, so as to from at least one further level of interconnections and wiring layers of the semiconductor device over the semiconductor substrate.

36. A process according to claim 35, wherein steps (a)-(g) are repeated 3 times, to form a total of four levels of interconnections and wiring layers of the semiconductor device over the semiconductor substrate.

37. A process according to claim 34, wherein, prior to performing step (a), a barrier layer for preventing migration of copper from said copper layer into the semiconductor substrate is provided on the semiconductor substrate, whereby said barrier layer is interposed between the substrate and the copper layer.

38. A process according to claim 34, wherein the etching of exposed portions of the copper is performed by reactive ion etching.

39. A process according to claim 38, wherein the reactive ion etching is performed at temperatures of 200° C.–500° C.

40. A process according to claim 34, wherein the copper layer is substantially completely covered with the anti-oxidizing layer at the time of removing the patterned photoresist layer, so as to avoid oxidation of the copper layer when removing the patterned photoresist layer.

41. A process according to claim 34, wherein the exposed portions of the copper layer are etched to form a plurality of the at least one of wiring layers and interconnections, the wiring layers and interconnection being less than 1 μm in width and being spaced from each other by less than 1 μm.

* * * * *